(12) United States Patent　(10) Patent No.: US 12,092,532 B2
Efetov et al.　(45) Date of Patent: Sep. 17, 2024

(54) HIGH RESOLUTION SUPERCONDUCTING NANO-CALORIMETER

(71) Applicant: FUNDACIÓ INSTITUT DE CIÈNCIES FOTÒNIQUES, Castelldefels (ES)

(72) Inventors: Dimitri K. Efetov, Castelldefels (ES); Paul Seifert, Castelldefels (ES); Xiaobo Lu, Castelldefels (ES); José Durán, Castelldefels (ES); Petr Stepanov, Castelldefels (ES)

(73) Assignee: Fundació Institut de Ciències Fotòniques, Castelldefels (ES)

( * ) Notice: Subject to any disclaimer, the term of this patent is extended or adjusted under 35 U.S.C. 154(b) by 876 days.

(21) Appl. No.: 17/091,368

(22) Filed: Nov. 6, 2020

(65) Prior Publication Data

US 2021/0140833 A1　May 13, 2021

(30) Foreign Application Priority Data

Nov. 8, 2019　(EP) .................................. 19382979

(51) Int. Cl.
*G01K 7/00*　(2006.01)
*H10N 60/84*　(2023.01)
*H10N 60/85*　(2023.01)

(52) U.S. Cl.
CPC .............. *G01K 7/006* (2013.01); *H10N 60/84* (2023.02); *H10N 60/85* (2023.02)

(58) Field of Classification Search
CPC ........... G01J 2005/208; G01J 2005/202; G01J 2005/077; G01J 5/20; G01J 5/00;
(Continued)

(56) References Cited

U.S. PATENT DOCUMENTS 6,455,849 B1 *　9/2002　Hilton ................... H10N 60/84
　　　　　　　　　　　　　　　　　　　　374/E7.003
7,376,403 B1 *　5/2008　Wanke ................. H01L 29/205
　　　　　　　　　　　　　　　　　　　　257/E29.091

(Continued)

FOREIGN PATENT DOCUMENTS

CN　　108 899 413 A　　11/2018
WO　WO 2017/119978　　7/2017

OTHER PUBLICATIONS

Cao et al., "Unconventional superconductivity in magic-angle graphene superlattices," Nature, vol. S56, pp. 43-55 (Apr. 5, 2018).
(Continued)

*Primary Examiner* — Dani Fox
*Assistant Examiner* — Soorena Kefayati
(74) *Attorney, Agent, or Firm* — Jenkins, Taylor & Hunt, P.A.

(57) ABSTRACT

Provided is a superconducting transition-edge thermal sensor, comprising a superconducting film defining an active area for incidence of quanta thereon, wherein the superconducting film is made of a superconductor exhibiting a charge carrier density below $10^{13}$ cm$^{-2}$ and an electronic heat capacity below $10^3$ kb at the critical temperature Tc of said superconductor, wherein the superconductor is formed by two or more layers of two-dimensional crystals stacked on top of another.

19 Claims, 9 Drawing Sheets

(58) Field of Classification Search
CPC .... G01J 5/0853; G01J 1/42; G01J 1/44; G01J 3/28; G01J 3/2803; G01J 2001/442; G01K 7/006; H10N 60/30; H10N 60/84; H10N 60/85; H10N 60/0241; H10N 60/855; H10N 60/853; H10N 60/858; H10N 60/857

See application file for complete search history.

(56) References Cited

U.S. PATENT DOCUMENTS

| | | | | |
|---|---|---|---|---|
| 9,869,592 | B2* | 1/2018 | Fong | G01J 5/0837 |
| 11,737,378 | B2* | 8/2023 | Sun | H10N 60/01 257/32 |
| 2010/0200755 | A1* | 8/2010 | Kawano | H01L 31/028 250/338.4 |
| 2010/0304977 | A1* | 12/2010 | Sadleir | H10N 60/84 29/599 |
| 2011/0102068 | A1* | 5/2011 | Bouchiat | G01N 27/4146 257/29 |
| 2013/0022077 | A1* | 1/2013 | Harmon | G01J 5/024 374/178 |
| 2016/0018267 | A1* | 1/2016 | Timofeev | G01J 5/024 438/54 |
| 2017/0038260 | A1* | 2/2017 | Fong | G01J 5/0818 |
| 2018/0045754 | A1* | 2/2018 | Zeldov | G01Q 60/58 |
| 2018/0364094 | A1* | 12/2018 | Kawano | G01J 3/42 |
| 2019/0019937 | A1* | 1/2019 | Allan | H10N 60/85 |
| 2019/0055129 | A1* | 2/2019 | Dimitrakopoulos | B01J 19/08 |
| 2019/0288177 | A1* | 9/2019 | Fong | H10N 60/85 |
| 2020/0075832 | A1* | 3/2020 | Burchard | C01B 32/205 |
| 2020/0309602 | A1* | 10/2020 | El Fatimy | G01J 5/20 |
| 2020/0320420 | A1* | 10/2020 | Hart | H01P 7/065 |

OTHER PUBLICATIONS

Chui et al., "Temperature fluctuations in the canonical ensemble," Phys. Rev. Lett., vol. 69, pp. 3005-3008 (1992).

Das Sarma, S., Adam, S., Hwang, E. H. & Rossi, E. Electronic transport in two-dimensional graphene. Rev. Mod. Phys. 83, 407-470 (2011).

Du et al., "Graphene-based Bolometers", Graphene and 2d Materials, vol. 1, pp. 1-22 (2014).

Extended European Search Report corresponding to European Patent Application No. 19382979.3 dated May 12, 2012.

Ni, G. X. et al. Fundamental limits to graphene plasmonics. Nature 557, 530-533 (2018).

Tielrooij, K. J. et al. Photoexcitation cascade and multiple hot-carrier generation in graphene. Nat. Phys. 9, 248-252 (2013).

Koshino, M. et al. (2018) "Maximally Localized Wannier Orbitals and the Extended Hubbard Model for Twisted Bilayer Graphene," Phys. Rev. X 8, 031087-1-12.

Liang et al. (2017) Interlayer bond polarizability model for stacking-dependent low-frequency Raman scattering in layered materials. Nanoscale.

Ni, G. X. et al. (2018) "Fundamental limits to graphene plasmonics," Nature 557, pp. 530-533.

Principi, A. et al. (2017) "Super-Planckian Electron Cooling in a van der Waals Stack," Phys. Rev. Lett. 118, 126804, pp. 1-7.

Tielrooij, K. J. et al. (2013) "Photoexcitation cascade and multiple hot-carrier generation in graphene," Nat. Phys. 9, pp. 248-252.

Wang et al. (2020) Correlated electronic phases in twisted bilayer transition metal dichalcogenides. Nat Mater 19(8):861-866.

Wang et al. (2020) Supplementary Information for Correlated electronic phases in twisted bilayer transition metal dichalcogenides. Nat Mater 19(8):861-866.

* cited by examiner

HIGH RESOLUTION SUPERCONDUCTING NANO-CALORIMETER

CROSS-REFERENCE TO RELATED APPLICATIONS

This application is based on and claims the benefit of priority from European Patent Application No. 19382979, filed on Nov. 8, 2019, the contents of which are expressly incorporated by reference herein.

The project leading to this application has received funding from the European Union's Horizon 2020 research and innovation programme under grant agreement No 820378.

FIELD OF THE INVENTION

The present invention generally relates to a superconducting transition-edge thermal sensor, and more particularly to a sensor comprising a superconducting film made of a superconductor exhibiting an ultra-low electronic heat capacity.

BACKGROUND OF THE INVENTION

The detection of quanta, and particularly of single photons, with a high sensitivity is nowadays desired and thus a key enabling technology in many research areas including quantum sensing, quantum key distribution, information processing and radio astronomy. Due to the scientific need and the technical feasibility, single photon detectors (SPDs) for wavelengths ranging from the visible to the telecommunication wavelengths, including near infrared (NIR), have already been developed and even commercialized.

State-of-the-art SPD technologies rely on heat-induced breaking of the superconducting state in nano-structured superconductors (SCs). Here, superconducting transition-edge sensors (TES) and superconducting nanowire single photon detectors (SNSPDs) have developed into the SPDs with the highest detection efficiencies and lowest dark count rates. State-of-the-art SNSPDs and TESs present by far the most advanced SPD technology in the visible to near infrared (IR) wavelengths, with highest sensitivity and lowest dark count rates.

However, while both SNSPDs and TESs operate with a high efficiency in the visible to near infrared (IR) wavelengths, the detection of lower energy photons in the mid-IR and terahertz (THz) wavelengths is not performed with a high efficiency with the detectors known in the prior art, and to this day such detectors are notoriously underdeveloped. In other words, extending the broadband detection of single photons from the nIR to the infrared or even the terahertz (THz), has yet to be demonstrated for SNSPDs and TESs. The performance of single photon detectors at these wavelengths is currently limited by the material properties of the used SC thin films, which are disordered, bulky and have high electronic heat capacity.

Specifically, with respect to TESs, those kind of sensors exploit the steepness of the temperature dependent resistance at the superconducting transition edge, which enables the generation of detectable voltages pulses upon heating electrons by absorbed light quanta. Because the energy of an absorbed photon is transferred to the whole ensemble of electrons, the performance of TESs is determined by the heat capacity of the calorimetric materials used. This currently limits the SPD operation of TESs to wavelengths below 8 µm, temperatures below 100 mK, and detection times above ~10 µs. Strategies to reduce the heat capacity have led to a targeted development of ever-thinner nano-structured SC thin films and the use of low carrier density SCs so that absorbed heat is shared among fewer electrons. However, traditional material fabrication approaches have set these developments a limit. The SC thin films are strongly disordered, polycrystalline, and have thicknesses exceeding several nanometers because they are obtained from high-electron-density SCs by sputtering and etching.

It is, therefore, necessary to provide an alternative to the state of the art which covers the gaps found therein, by providing a TES, particularly a superconducting transition-edge thermal sensor, which does not have the above mentioned drawbacks associated to those already known in the art, and which dramatically breaks through the above mentioned limits in operation wavelengths, temperatures and detection times.

SUMMARY OF THE INVENTION

To that end, the present invention relates to a superconducting transition-edge thermal sensor, comprising a superconducting film defining an active area for incidence of quanta thereon.

In contrast to the superconducting transition-edge thermal sensors known in the prior art, in the one of the present invention, the superconducting film is made of a superconductor exhibiting a charge carrier density below $10^{13}$ cm$^{-2}$ and an electronic heat capacity below $10^3$ $k_b$ at the critical temperature $T_c$ of said superconductor, wherein the superconductor is formed by at least two layers of two-dimensional crystals stacked on top of another.

The present inventors have tested and perform detailed mathematic calculations (some of which will be set forth below in this document) of many superconducting materials and arrangements, to find out which are the ones which fit the above indicated requirements, in order to make the above mentioned at least two layers with the appropriate superconducting materials according to the appropriate arrangement.

The appropriate superconducting materials and arrangements are listed below, for some embodiments. Further embodiments including alternative superconducting materials and arrangements which meet the above mentioned requirements of charge carrier density and electronic heat capacity are also embraced by the present invention.

The use of the superconducting materials and arrangements listed below to make superconducting transition-edge thermal sensors is not known in the art, and their suitability for the here intended purpose is not either known or expected in the art. Indeed, to discover that those materials have a so low electronic heat capacity the present inventors had to carry out detailed tests and mathematic calculations, which had not been done in the state of the art.

For an embodiment, the above mentioned at least two layers are two layers of graphene twisted by an angle of 1.1°±0.1° with respect to each other so that they form a Moiré superlattice, i.e. the material commonly known as magic-angle graphene. The superconductivity occurs at a carrier density as low as $0.5*10^{12}$ 1/cm$^{-2}$. In contrast to conventional superconductors, magic-angle graphene as a two-dimensional single crystal with ultra-high electronic quality exhibits several orders of magnitude lower electron density and, as will be expounded below, the present inventors have discovered that such material also exhibits several orders of magnitude lower electronic heat capacity compared to conventional superconductors used as single photon detectors. These attributes position magic-angle graphene as an absolutely exceptional material for single photon sensing applications and will enable the detection of lower energy photons in the mid-IR and terahertz (THz) wavelengths with a high resolution and a fast response time.

For another embodiment, the at least two layers are two bilayers of graphene twisted by an angle of 1.3°±0.1° with respect to each other so that they form a Moiré superlattice, wherein the graphene layers within each bilayer are aligned at 0.0° with respect to each other. The superconductivity occurs at a carrier density as low as $2.45*10^{12}$ $1/cm^{-2}$.

For a further embodiment, the at least two layers are two bilayers of $WSe_2$ twisted by an angle ranging from 1° to 4° with respect to each other so that they form a Moiré superlattice, whereas the $WSe_2$ layers within each bilayer are aligned at 0.0° with respect to each other. In the range between 1° and 4°, flatbands can be observed which support superconductivity. The superconductivity occurs at a carrier density as low as $7*10^{12}$ $1/cm^{-2}$.

According to another embodiment, the at least two layers are three layers of graphene which are aligned with a twist angle of 0° with respect to each other, with a stacking order of the graphene layers corresponding to the ABC stacking order, forming a trilayer graphene. The superconductivity occurs at a carrier density as low as $0.5*10^{12}$ $1/cm^2$.

For any of the above described embodiments, the at least two layers are hermetically air- and water-sealed with a sealing material, so that surface degradation by oxidation is avoided. The sealing guarantees a high crystalline quality and protect the at least two layers from environmental influences.

According to an implementation of that embodiment, the at least two layers are encapsulated by the above mentioned sealing material, wherein that sealing material is an air- and water-impenetrable Van-der-Waals material, and preferably placed on a substrate (generally a flat substrate).

Alternatively, the at least two layers are not encapsulated but only covered with the sealing material, because the at least two layers are arranged on a substrate (preferably a flat substrate) which already air- and water-seals the at least two layers from their bottom side.

For an implementation of the above described embodiment referring to the trilayer graphene, the air-impenetrable Van-der-Waals material is hexagonal boron nitride, forming a heterostructure into which the trilayer graphene is embedded and which gives rise to a Moiré superlattice due to a mismatch in lattice constant.

All the superconductor materials disclosed above for different embodiments of the sensor of the present invention, are low carrier density superconductors, where the superconducting state appears at carrier densities below $10^1$ $1/cm^{-2}$. The present inventors have discovered that those materials also exhibit an ultra-low electronic heat capacity which is orders of magnitude lower than in other superconductors, and have found out as the main cause leading to such ultra-low electronic heat capacity the contribution of the electrons which are within the energetic range of $3/2$ $k_BT$ from the Fermi energy.

According to an embodiment, the encapsulated at least two layers are patterned on a substrate forming nanostructures, i.e. structures with dimensions in a nanometer scale.

For an embodiment, the sensor of the present invention comprises a back gate, which allows to tune the charge carrier density of the superconductor by applying a gate voltage thereto.

For another embodiment, the application of an appropriate gate voltage to that back gate can be used to tune the wavelength detection range, making that range narrower or wider.

The superconducting transition-edge thermal sensor of the present invention further comprises, for an embodiment, at least two electrodes arranged and making electrical contact with respective locations of the active area of the superconducting film longitudinally distanced from each other, wherein the at least two electrodes are operatively connected with a control unit to current- or voltage-bias the superconducting film and/or to read-out an electrical signal caused or modified by a transition between a superconducting and a non-superconducting phase occurring in the active area upon incidence of said quanta thereon.

Although the sensor of the present invention is generally intended for photodetection purposes, for detecting light quanta, i.e. photons, the sensor is also suitable for detecting non-light quanta, as far as that non-light quanta can be absorbed by the superconductor and carries energy to raise its temperature.

For some preferred embodiments, the active area of the superconducting film is configured and arranged to undergo a transition between a superconducting and a non-superconducting phase upon incidence of quanta included in electromagnetic radiation having a wavelength of interest.

Generally, the above mentioned air-impenetrable Van-der-Waals material is transparent to at least the wavelength of interest of an electromagnetic wave associated to photons constituting the above mentioned quanta, i.e. to the photons to be detected.

According to an implementation of the above preferred embodiments, the at least two electrodes are configured and shaped to form an antenna for allowing or improving electromagnetic coupling between the active area and the electromagnetic radiation having a wavelength of interest.

Complementarily or alternatively, at least the active region is embedded in a ring resonator, Fabry-Perot cavity, photonic crystal cavity or other type of optical cavity, for optical coupling with the electromagnetic radiation having a wavelength of interest.

The shape and dimensions of the active area, i.e. of the at least two layers forming the superconductor, can be adjusted in order allow easy integration with different antenna and cavity designs in order to match the desired detection wavelength.

Preferably, the wavelength of interest ranges from the visible spectrum to THz radiation, although other wavelengths are also embraced by the present invention, such as those of ultraviolet radiation.

According to an embodiment, the superconducting transition-edge thermal sensor constitutes a calorimeter configured and arranged for measuring the energy of single quanta incident on the active area of the superconducting film, implemented according to any of the embodiments and implementations of the superconducting transition-edge thermal sensor of the present invention described in the present document, unless explicitly described as referring to another kind of device which is not a calorimeter.

According to another embodiment, the superconducting transition-edge thermal sensor constitutes a bolometer configured and arranged for measuring the energy flux of quanta incident on the active area of the superconducting film, implemented according to any of the embodiments and implementations of the superconducting transition-edge thermal sensor of the present invention described in the present document, unless explicitly described as referring to another kind of device which is not a bolometer.

Among the different sensors/detectors, some confusion might exist regarding how different authors name their devices. Expressions such as bolometer, calorimeter, thermal detector or photon (or quantum) detector are used. In addition, coherent detectors, e.g. heterodyne receivers, could also be discussed in the context of superconductive bolometers. All of those expressions are valid for defining the sensor of the present invention, for some embodiments.

Since the exploitation of heating effects from single photons absorbed in a superconductor represents a main detection principle in modern single photon detectors, the sensor of the present invention, which includes a superconductor material with such a low electronic heat capacity, can be used to advance the single photon detection technology towards low energy photons.

The present invention constitutes both the first use of a two-dimensional material in an energy resolving superconducting calorimeter, and, at the same time, the first use of a two-dimensional, crystalline moiré superlattice in any practical application.

The present invention has many different and possible applications. Namely, it can be used for quantum communication protocols, such as quantum key distribution and the Bells inequality test, for quantum information, and for quantum sensing. Observational astronomy, particularly radioastronomy, is also a possible application, where the interest is in detecting the energy of long wavelength single photons (mid-IR to THz wavelengths). Here there is no competing technology, so the sensor of the present invention could be an enabling technology. Further applications are thermal imaging, such as nano-calorimeter based image arrays, and cameras for low-energy light microscopy. The orders of magnitude better energy resolution of the sensor of the present invention will revolutionize the applicability of nano-calorimeter to even more advanced technologies.

Combinations of two or more of any of all the embodiments and implementations described in the present document are embraced by the present invention, in case those combinations are feasible and lead to a working embodiment.

BRIEF DESCRIPTION OF THE FIGURES

In the following some preferred embodiments of the invention will be described with reference to the enclosed figures. They are provided only for illustration purposes without however limiting the scope of the invention.

FIG. 1A. Schematic illustration of the MATBG sensor/device. A twisted bilayer of graphene with twist angle of 1.1 degrees is sandwiched between two sheets of hBN and embedded into a lateral gold/MATBG/gold photodetector geometry on a Si/SiO$_2$ substrate (Su) comprising a local graphite gate-electrode (not shown). At low temperatures the sheet resistance drops to zero at optimum doping. When a photon of a certain energy $E=\hbar\omega$ is absorbed the temperature of the MATBG sheet is driven across the superconducting transition edge, giving rise to a voltage drop proportional to an applied bias current. The Voltage response relaxes with the thermal relaxation time of the system. FIG. 1A. Film thickness and carrier density for different two-dimensional superconductors as well as selected thin film superconductors below 10 nm which are commonly used in single photon detection applications. The plot includes crystalline 2D superconductors (ZrNCl, BSCCO, NbSe$_2$, MoS$_2$, WTe$_2$), interfacial 2D superconductors (STO/LAO, FeSe/STO), elemental thin film superconductors (Nb, Al) and compound thin film superconductors of crystalline (NbN) and amorphous (WSi, MoSi) materials as well as MATBG (yellow star). The inset depicts the experimentally obtained resistance of the sensor of the present invention, i.e. of the MATBG device, as a function of carrier density n and base temperature T exhibiting a variety of phases including metallic, correlated and superconducting states.

FIG. 2A. Electronic heat capacity as a function of T as calculated from the density of states. The inset depicts the calculated low-energy band structure at the magic-angle. FIG. 2B. Photon absorption induced temperature increase ΔT of the superconducting dome at $n=1.1 \cdot 10^{12}/cm^{-2}$ as a function of the photon frequency for different base temperatures. FIG. 2C. Resistance R and dR/dT of the MATBG device at $n=1.1 \cdot 10^{12}/cm^{-2}$ as a function of temperature T. The inset depicts an optical microscopy image of the MATBG device. Scale bar is 2 m.

FIG. 3A. Photon induced voltage drop ΔV across the MATBG sheet at an applied bias current of 20 nA as a function of base temperature and photon frequency. The white triangles indicate the points of maximum voltage response. The inset shows the experimentally obtained/V characteristics of the MATBG device. FIG. 3B. Thermal conductance contributions heat dissipation via electron-phonon scattering $G_{e-ph}$ and the Wiedemann Frantz law $G_{WF}$, and thermal relaxation time $\tau_{th}$ as a function of the device temperature. The inset depicts an illustration of heat dissipation channels of hot electrons in MATBG after photon absorption. FIG. 3C. Transient voltage response of the MATBG sheet at $T=T_c$ due to the absorption of a photon for frequencies from 0.5 THz to 20 THz.

FIG. 4A. Histogram of the potentially detected energy distribution of two different photon energies after measuring thousands of photons. Due to the energetic broadening, two photon energies can be distinguished only if their energies are separated by more than the full width at half maximum of ΔE. FIG. 4B. Energy scale ΔE of thermodynamic fluctuations and associated relative temperature fluctuations δT/T as calculated from the electronic heat capacity. FIG. 4C. Maximum frequency resolution (Δf) of a single photon detection in MATBG in the thermodynamic limit and relative photoresponse amplitude at 1 THz (V/V$_{max}$) as a function of device temperature.

FIG. 5A. Calculated band structure and density of states of magic-angle twisted bilayer graphene. FIG. 5B. Corresponding electronic heat capacity as a function of the temperature as calculated from the band structure and density of states in FIG. 5A, of a 250 nm×250 nm calorimeter according to the present invention, for an embodiment for which the superconductor is made from magic-angle twisted bilayer graphene.

FIG. 6A. Top view: Active area (SC) of the nano-calorimeter comprising a width (B) and length (A), which is electrically contacted to two electrodes (E1 and E2) for a first embodiment. FIG. 6B. Isometric view of the nano-calorimeter of the first embodiment. FIG. 6C. Top view: Active area of the nano-calorimeter (SC) comprising a width (B) and length (A), which is electrically contacted to two electrodes (E1 and E2) and where the electrodes (E1 and E2) form a THz-antenna (shown only in part), according to a second embodiment. FIG. 6D. Isometric view of the nano-calorimeter of the second embodiment. FIG. 6E. Top view: Electrodes (E1 and E2) forming the THz-antenna with width (C) and length (D), where the active region (SC) of the nano-calorimeter is the lumped dissipative element in the THz-antenna, also according to the second embodiment. FIG. 6F. Isometric view of the nano-calorimeter shown in e, where the antenna-forming electrodes (E1, E2) and active area (SC) are arranged on a substrate (Su).

FIG. 7A. Resistance R as function of temperature $T_0$ for the superconducting domes at $n=5 \cdot 10^{11}/cm^2$, $n=5 \cdot 10^{11}/cm^2$ and $n=-1.7 \cdot 10^{12}/cm^2$. FIG. 7B. dR/dT as function of temperature $T_0$ for the different superconducting domes. FIG. 7C. Electronic heat capacities as a function of temperature $T_0$. FIG. 7D. Thermal conductance contribution $G_{th}$ from electron-phonon interaction. FIG. 7E. Thermal relaxation time $\tau_{th}$ as a function of the device temperature. FIG. 7F. Maximum energy resolution of a single photon detection in MATBG.

FIG. 8A. Relative voltage relaxation after the absorption of a 1-THz photon for different device temperatures.

FIG. 8B. Relative voltage relaxation after the absorption of a photon of 1 THz and 10 THz for $T=T_c$.

FIG. 9A. Transient thermal response of the MATBG sheet at $T=T_c$ due to the absorption of a photon for frequencies from 0.5 THz to 20 THz. FIG. 9B. Corresponding transient voltage response according to the temperature transient in (a).

DESCRIPTION OF THE PREFERRED EMBODIMENTS

In the present section some working embodiments of the sensor of the present invention will be described in detail, particularly for implementations of the invention for which the sensor is a nano-calorimeter which superconducting film is made from superconducting magic-angle twisted bilayer graphene, also called magic-angle graphene, which will be used for energy resolved high speed single photon detection.

In the MATBG calorimeter here analyzed, by stacking two graphene layers one on top of one another with a relative twist-angle between the layers, a "Moiré" pattern gives rise to a long wavelength periodic potential. It was shown that for a well-defined twist-angle of 1.1°, the so-called "magic" angle, flat bands with ultra-high density of states (DOS) (as compared to normal graphene) are formed and give rise to interaction driven correlated insulating and dome shaped superconducting phases with a Tc>3K.

In contrast to conventional SCs, magic-angle graphene as a two-dimensional single crystal with ultra-high electronic quality exhibits several orders of magnitude lower electron density and, as will be expounded below, the present inventors have discovered that such material also exhibits several orders of magnitude lower electronic heat capacity compared to conventional superconductors used as single photon detectors. These attributes position magic-angle graphene as an absolutely exceptional material for single photon sensing applications and will enable the detection of lower energy photons in the mid-IR and terahertz (THz) wavelengths with a high resolution and a fast response time.

In the present section, the present inventors demonstrate, by means of electronic transport experiments, that the superconductor material (magic-angle graphene), used for making a calorimeter according to an embodiment of the sensor of the present invention, exhibits the material properties necessary for single photon detection. Particularly, to demonstrate its ultra-low electronic heat capacity, a single photon calorimeter from magic-angle twisted bilayer graphene (MATBG) is presented. A full detailed theoretical analysis of the theoretically achievable single photon detection performance of the calorimeter is also provided.

The present inventors also demonstrate the feasibility of preparing energy resolved SPDs from MATBG, by estimating its thermal response due to the absorption of single photons. Due to the steep temperature-dependent resistance at its SC transition edge, photon generated voltage pulses are created which can be directly read out.

Figure 1A:
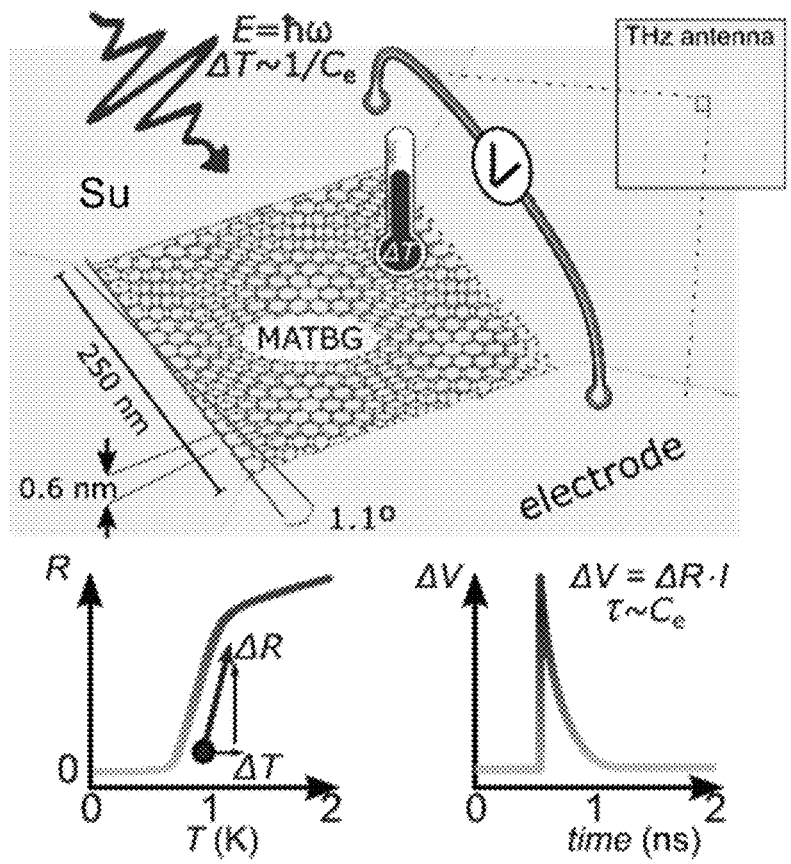
FIGS. 1A and 1B are related to an embodiment of the sensor of the present invention, for which the superconductor is formed by two layers of graphene twisted by an angle of 1.1°±0.1° with respect to each other, i.e. by a magic-angle twisted bilayer graphene (referred below as MATBG), implementing a single photon nano-calorimeter.
Figure 1B:
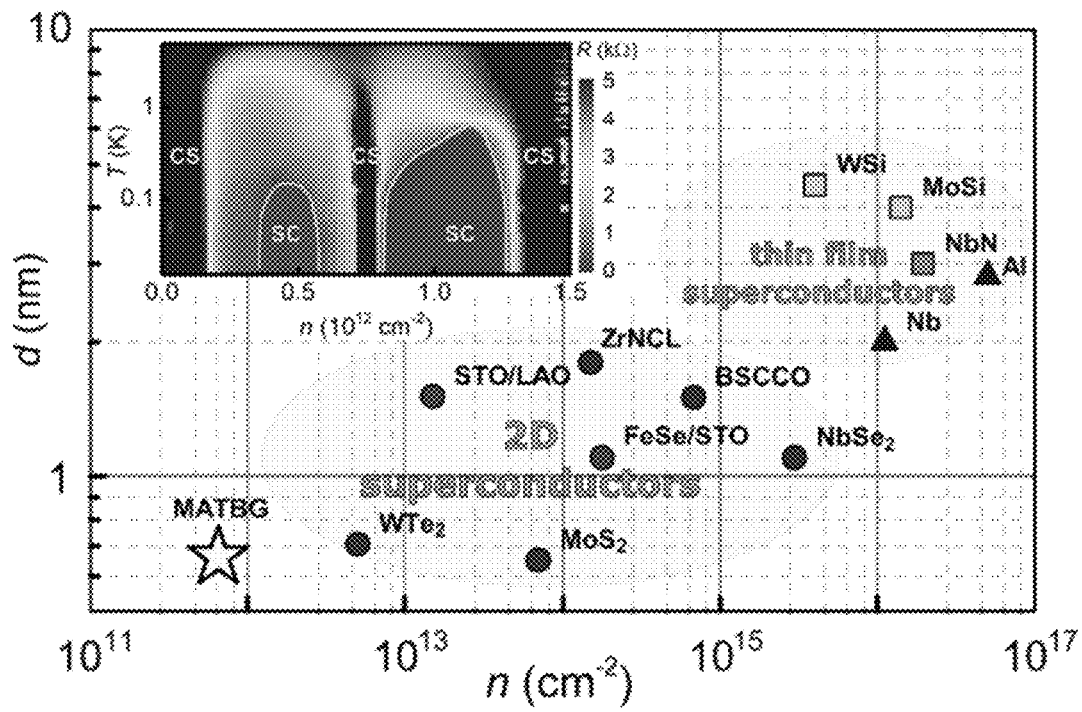

FIG. 1(a) depicts the schematics of the here studied sensor/detector, which is comprised of an electrically contacted 250 nm×250 nm superconducting MATBG sheet on top of a $Si/SiO_2$ substrate Su, which acts as a capacitive back gate that allows to tune n by applying a gate voltage. For some embodiments, the application of an appropriate gate voltage to that capacitive back gate can be used also to tune the wavelength detection range, making that range narrower or wider. While in MATBG, the superconducting gap will vanish for $T_0 \rightarrow T_c$ allowing, in principle, a broadband optical absorption even at frequencies way below THz, the absorption coefficient in graphene at low energies is only ~2.3%. However, one can work around it, where several approaches have been successfully developed and implemented to enhance the absorption of graphene to almost 100% by incorporating it with photonic crystals, Fabry-Perot microcavities or ring resonators for operation in the near-IR and mid-IR wavelengths, as well as integrations with an antenna for THz operation. Importantly, after an electron absorbs the energy of a photon, the energy is thermalized within the electron bath via electron-electron scattering on a timescale of ~100 fs which is much faster than the relaxation time to the Fermi energy. Hence, the subsequent photo-excited electron distribution can be described via an effective electron temperature that is in first order decoupled from the lattice.

Figure 2A:
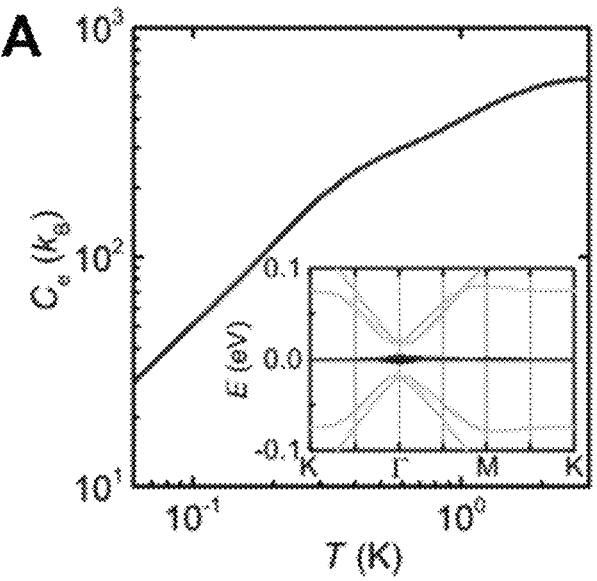
FIGS. 2A, 2B and 2C. Intrinsic thermal properties of the MATBG device.
Figure 5A:
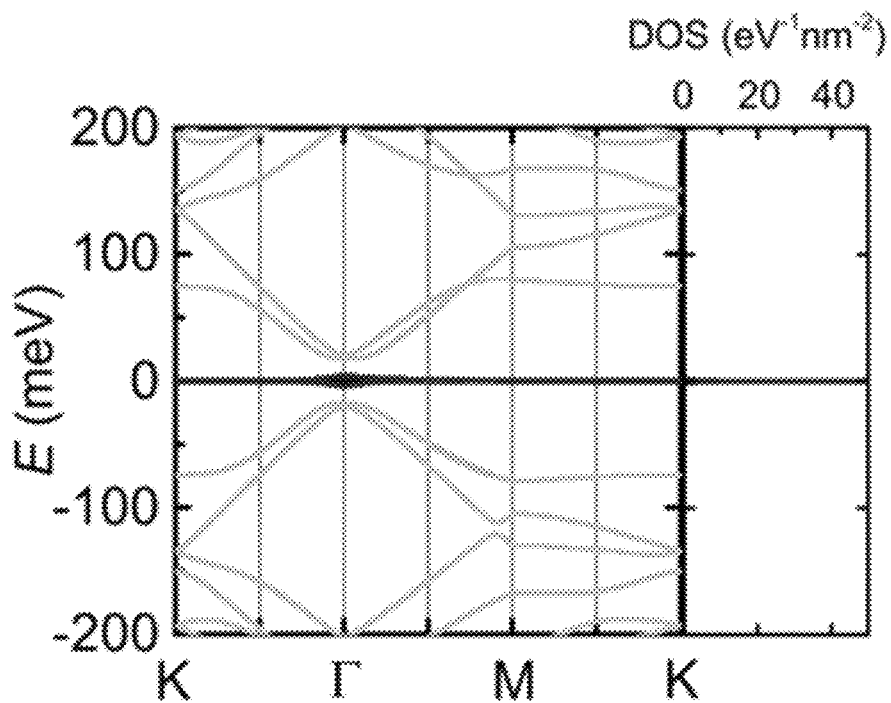
FIGS. 5A and 5B.
Figure 5B:
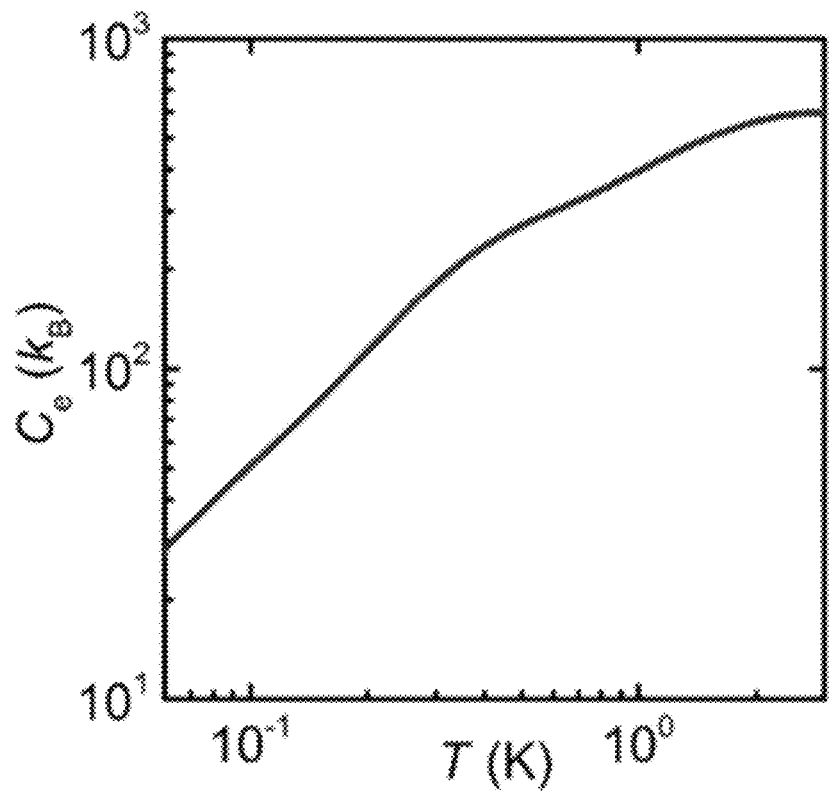
Figure 6A:
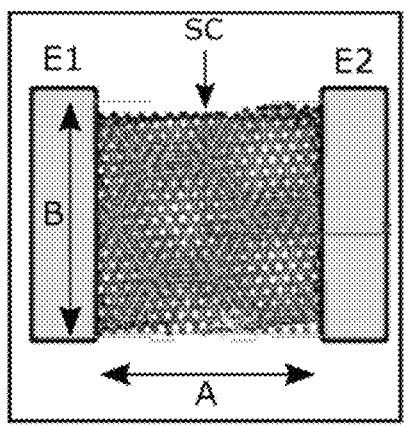
FIGS. 6A to 6F. Sketch of a nano-calorimeter (i.e., a calorimeter with dimensions in a nanometer scale) implementing the sensor of the present invention, for a first and a second embodiments.
Figure 6B:
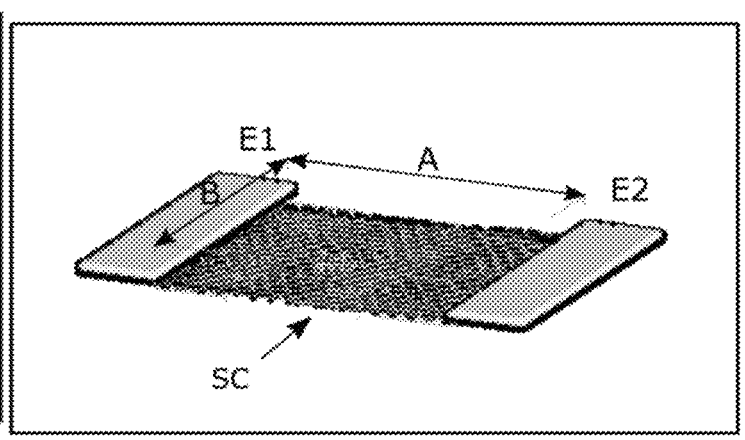
Figure 6C:
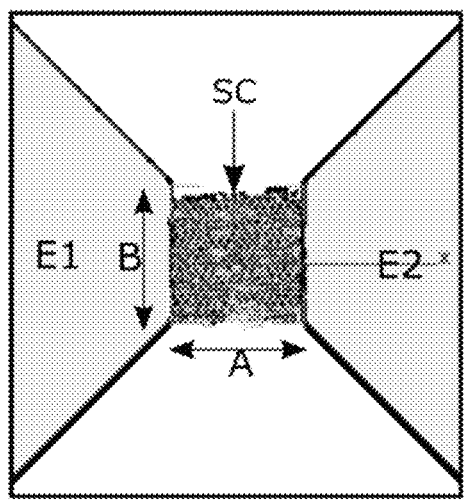
Figure 6E:
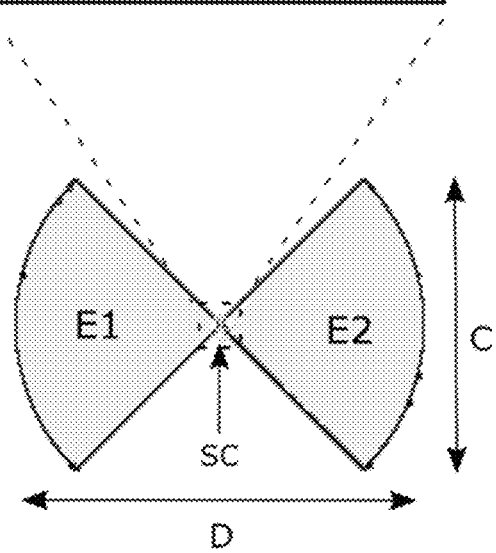
Figure 6D:
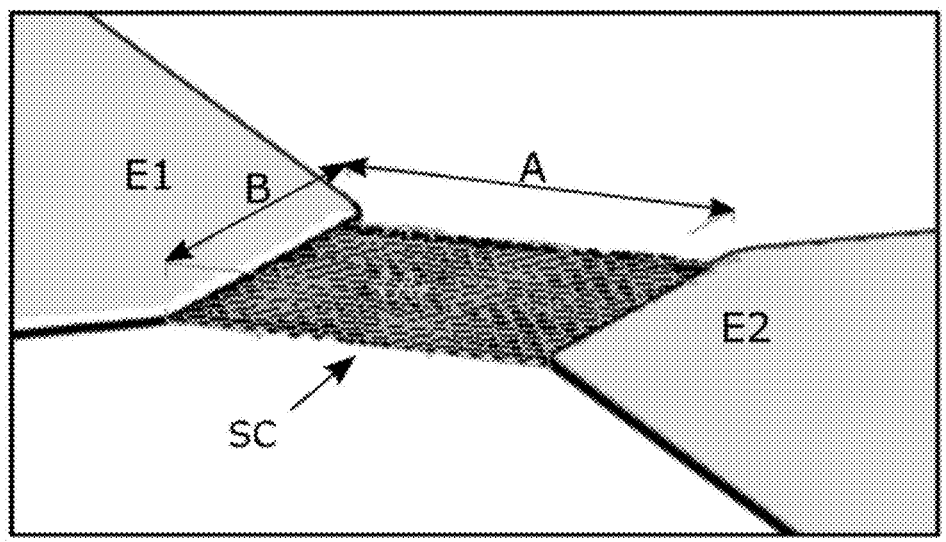
Figure 6F:
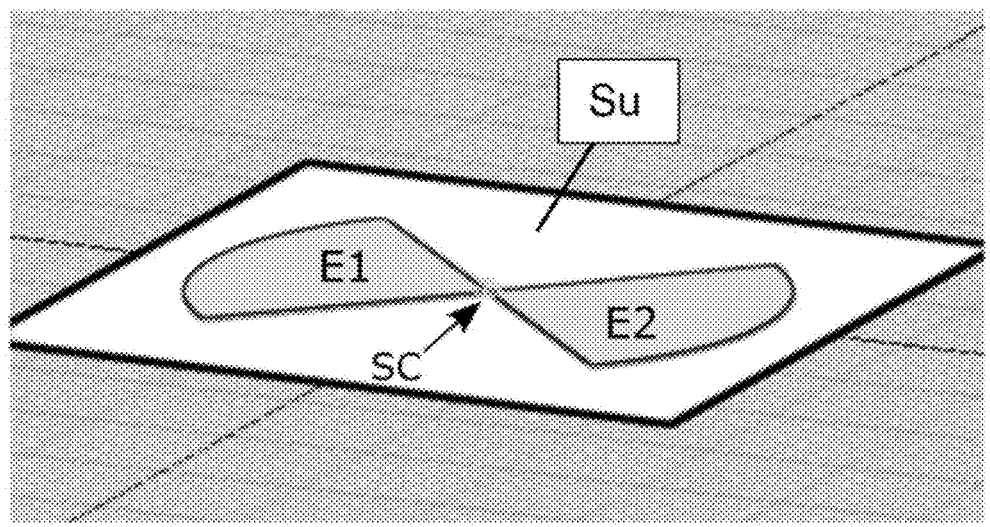
Figure 7A:
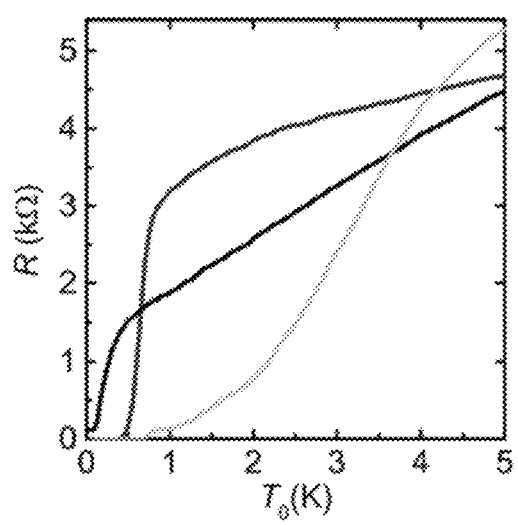
FIGS. 7A to 7F. Comparison between superconducting domes.
Figure 7B:
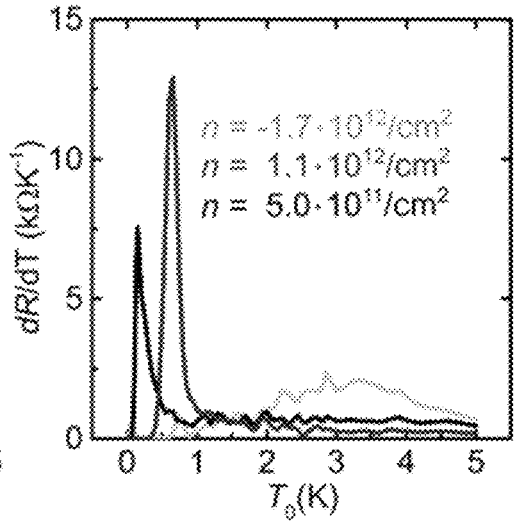
Figure 7C:
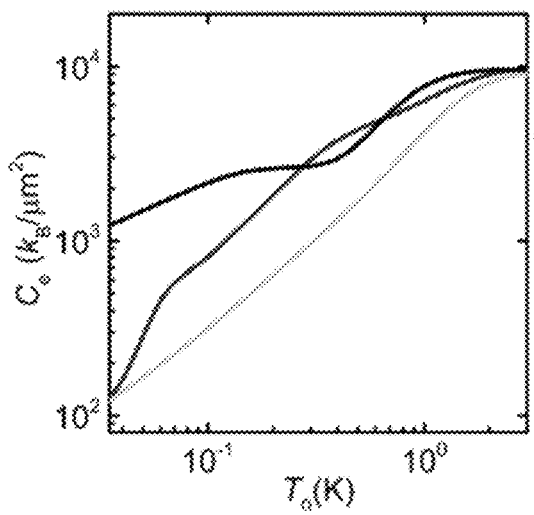

First, the thermal properties of the MATBG electrons are quantified by calculating its temperature dependent electronic heat capacity $C_e(T)$. The present inventors first calculated the single particle band-structure of MATBG, where ultra-flat bands close to charge neutrality (bands in FIG. 2A, inset, and FIG. 5A) were obtained. From this band structure and the DOS one can further calculate the electronic heat capacity. Specifically, from the energy dispersion of these "Moiré" bands one can then extract the density of states in order to obtain $C_e(T)$ (see "Calculation of heat capacity and cooling time" below). FIGS. 2A and 5B show $C_e$ as a function of temperature T for $n=1.1 \cdot 10^{12}/cm^2$, which coincides with the density of one SC dome (see FIG. 7C for other SC domes). Remarkably, the present inventors discovered that the low carrier density leads to an electronic heat capacity with values, at temperatures close to the SC $T_c$, which are extremely small, in the order of just several hundred $k_b$, which is 2-3 orders of magnitude lower than in any other superconducting single photon detector exhibiting heat capacities in the range of $10^4$-$10^5$ $k_b$. These calculations are also valid for all the superconducting materials mentioned in a previous section for different embodiments.

Therefore, as the low electronic heat capacity directly scales with the low carrier density, all those superconducting materials will show a similar detection performance than the MATBG when used as the active area of the sensor of the present invention.

Figure 2B:
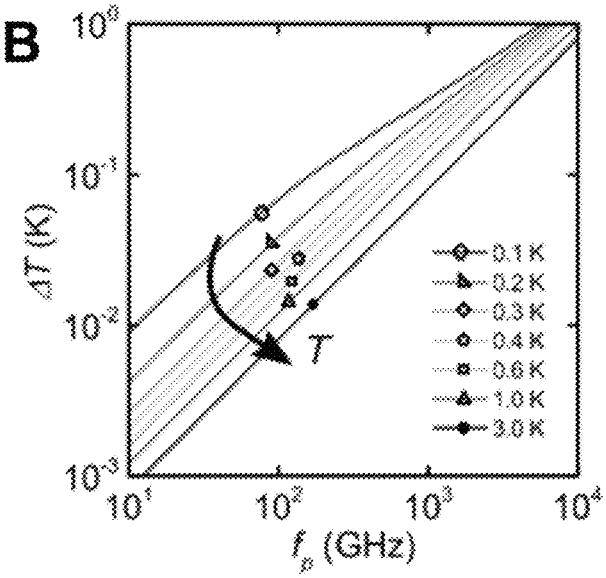
Figure 2C:
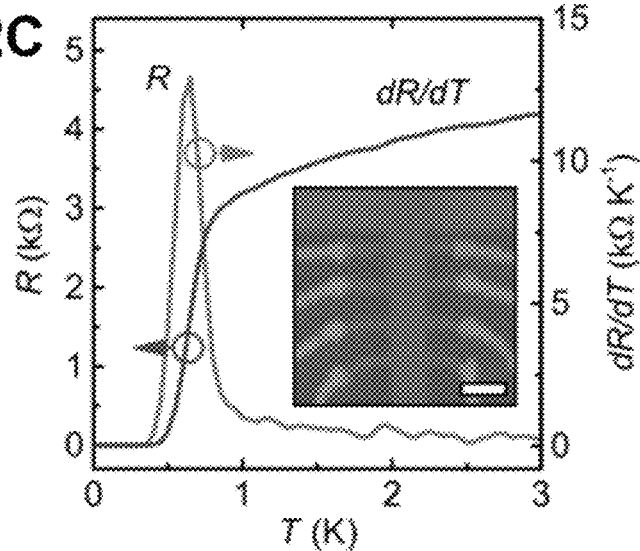

By equating the energy of an incident photon with the absorption-induced increase in internal energy $\hbar\omega = \int_{T_0}^{T_{max}} C_e(T) dT$, the present inventors calculated the temperature increase $\Delta T$ of the electrons in the MATBG sheet upon photon absorption. FIG. 2B depicts the corresponding $\Delta T$ as a function of photon frequency for different temperatures T. Remarkably, for $T \lesssim T_c$, the present inventors found relatively large values for $\Delta T$ in the order of several K for the absorption of mid-IR photons, but even for photons in the THz and 100 GHz frequencies, $\Delta T$ remains sizable in the order of 10-100 mK. To achieve an optimum detection performance, a sharp SC transition is highly desirable, as it enables to generate detectable voltage pulses even from weak photon-induced heat pulses. FIG. 2C shows experimentally obtained R and dR/dT as a function of temperature T for optimal doping of the superconducting dome at $n=1.1 \cdot 10^{12}/cm^{-2}$ (FIGS. 7 (a) and (b) for other SC domes). Around a critical temperature of $T_c=0.65$ K, the device exhibits a very sharp transition edge with a large resistance change.

Figure 3A:
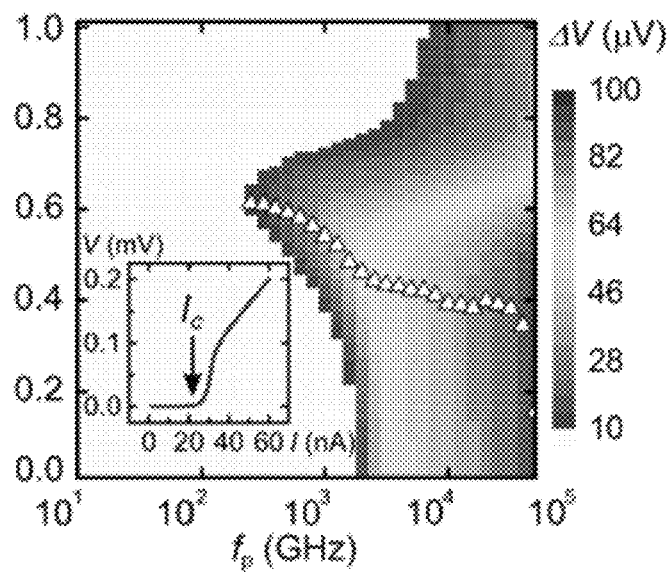
FIGS. 3A, 3B and 3C. Photoresponse and relaxation time in magic-angle graphene.

In order to evaluate the intrinsic detector performance the present inventors extracted the photon induced voltage change $\Delta V$ across a current biased MATBG sheet (see "Calculation of detector response and energy resolution" below). This was achieved by combining the temperature dependent resistivity at the superconducting transition with the calculated temperature change due to the absorption of a single photon $\Delta T$. FIG. 3A inset shows the experimentally obtained I/V characteristics of the MATBG device, where the present inventors found a superconducting critical current $I_c > 20$ nA. To maximize $\Delta V$ the device is current biased just below $I_c$ to $=20$ nA. The so obtained $\Delta V$, as a function of T and frequency of the absorbed photon $f_p$, is shown in FIG. 3A. Strikingly, relatively large voltage signals in the order of tens of μV for a very broad range of photon frequencies, from the nIR all the way to ~100 GHz, are found.

The lifetime of the voltage pulses is determined by the intrinsic thermal relaxation pathways of the thermally excited electrons in the MATBG sheet. Here, as is well established for single layer graphene devices, the present inventors assumed that the dominant heat dissipation channels are via the electron-phonon interaction from acoustic gauge phonons ($G_{e-ph}$) and from heat diffusion to the electrodes via the Wiedemann-Franz law ($G_{WF}$), the corresponding thermal conductivity of which is plotted in FIG. 3B. In contrast to single layer graphene, where the electron-phonon interaction at low T is relatively small, the present inventors found that in MATBG $G_{e-ph}$ dominates over $G_{WF}$ by several orders of magnitude at all temperatures. the present inventors do not consider a cooling via optical phonon scattering and radiative cooling as the energies involved are much smaller than the one of optical phonons and radiative cooling $G_{rad}$ can be estimated to $G_{rad} \sim k_B \cdot B$, where B is the measurement bandwidth, yielding values, which are at least 5 orders of magnitude smaller than $G_{e-ph}$ for B=1 GHz.

Figure 3B:
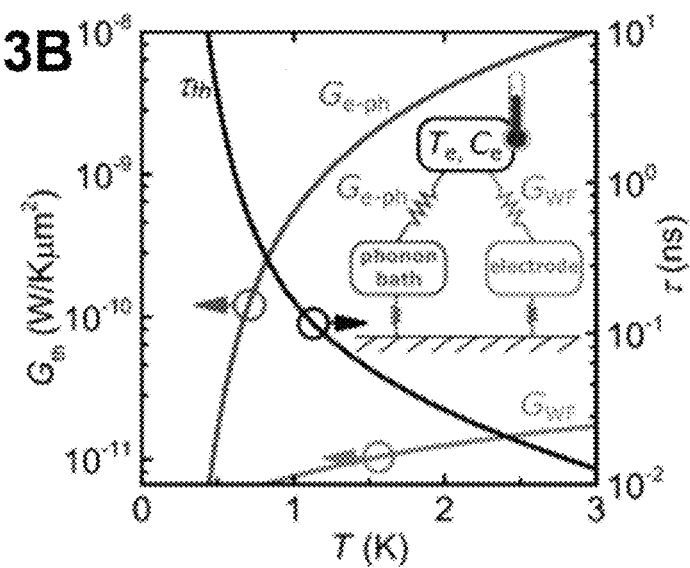
Figure 3C:
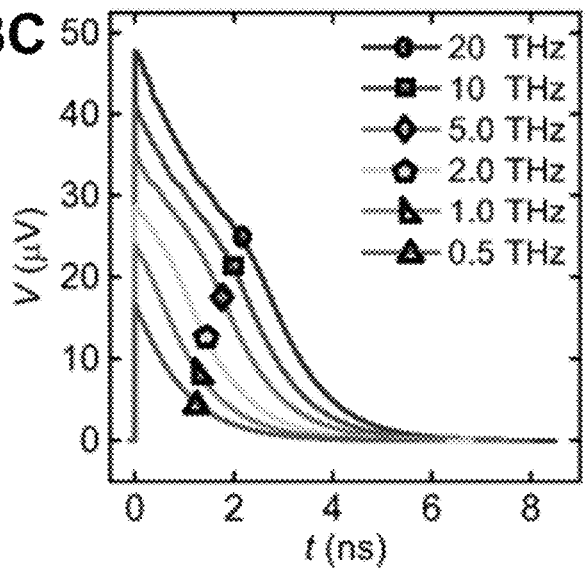
Figure 7D:
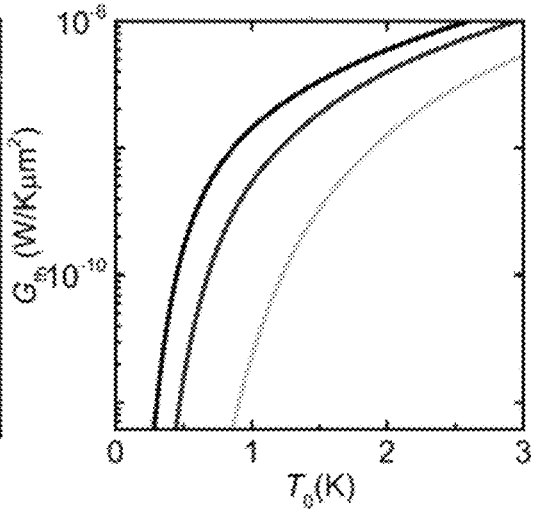
Figure 7E:
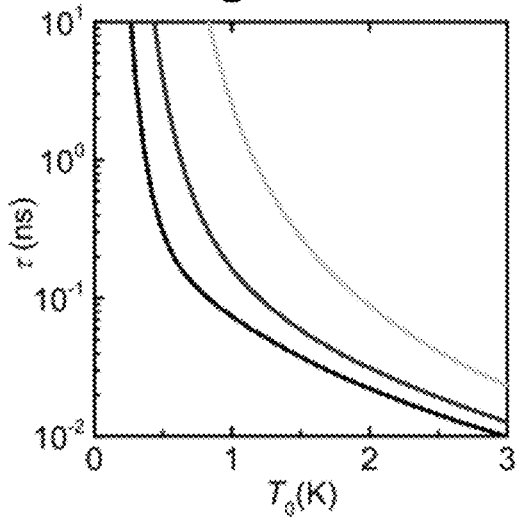
Figure 7F:
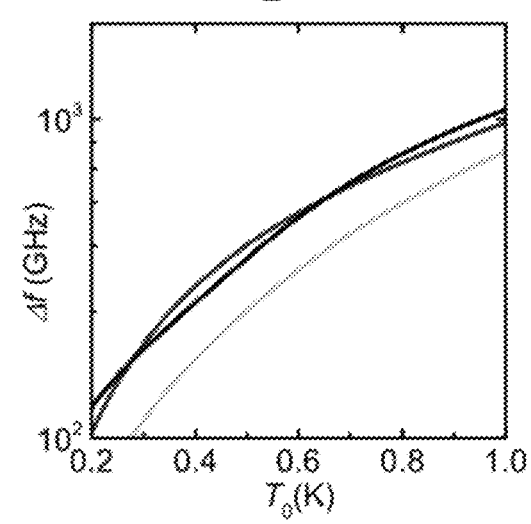
Figure 8A:
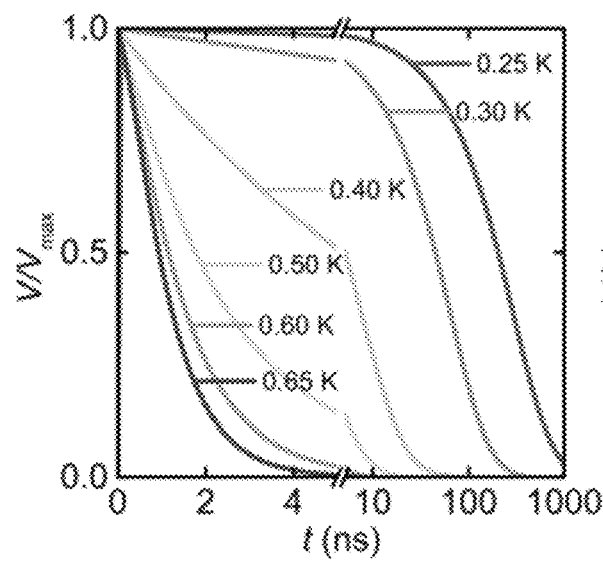
FIGS. 8A and 8B. Relaxation time in magic-angle graphene.
Figure 8B:
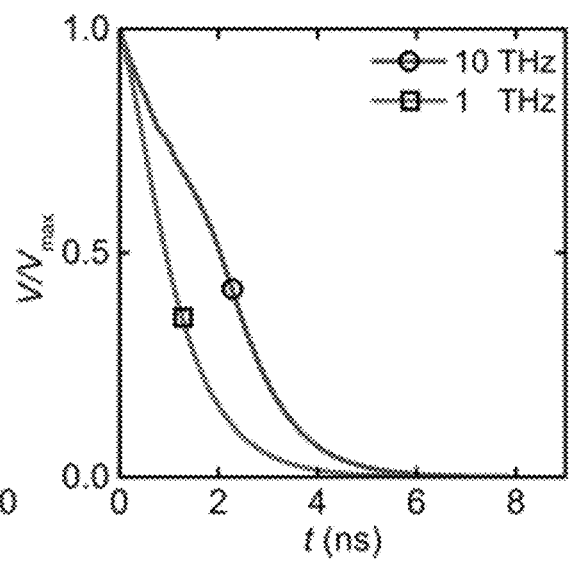
Figure 9A:
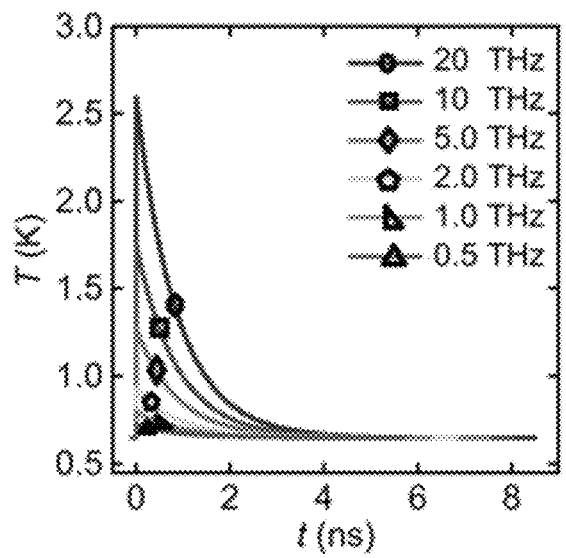
FIGS. 9A and 9B. Transient relaxation of voltage response.
Figure 9B:
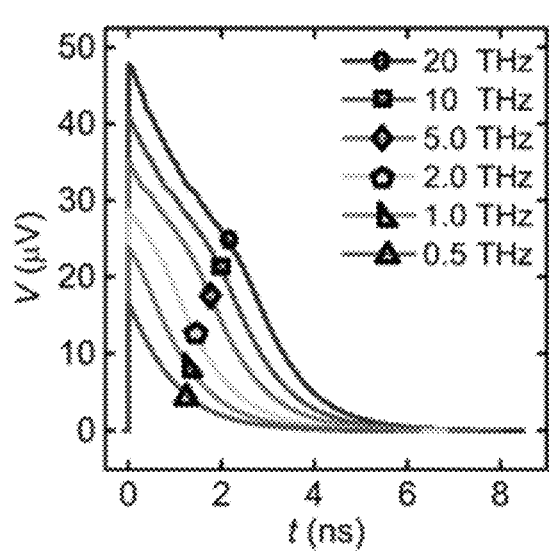

Having established $G_{e-ph}$ as the dominant heat relaxation mechanism, the present inventors obtained the thermal relaxation time $\tau$ for different T, through the quasi-equilibrium relation $G_{e-ph} \cdot \tau = C_e$, as is shown in FIG. 3B (see "Calculation of heat capacity and cooling time" below and FIGS. 7D and 7E for other SC domes). FIG. 3C shows the transient thermal response of the device after photon absorption at a temperature of $T=T_c$ for photon frequencies between 0.5 THz and 20 THz (see also FIGS. 8A-8B and 9A-9B). Remarkably, for all photon frequencies the hot electron distribution relaxes within ~4 ns, which is orders of magnitude faster than other superconducting single photon detectors exhibiting recovery times on the order of nanoseconds in SNSPDs and even microseconds in TES. The present inventors note that at lower device temperatures the decreasing electron-phonon interaction leads to strongly increasing relaxation times surpassing 100 ns at T=0.3 K and even 1 μs at T=0.25 K (compare FIG. 8A).

Depending on the final detector architecture, the fast intrinsic photo-response of the MATBG can be further processed with broadband low-noise amplifiers, such as HEMTs. Another approach for processing the response is a kinetic inductance detection (KID), which is based on a change in the MATBGs kinetic inductance upon photon absorption leading to a shift of the resonance frequency in a coupled micro-resonator. Compared to a resistive read-out, the KID is applicable far below the superconducting transition possibly allowing for even higher sensitivities. In principle however, given a direct on-chip read-out, the obtained voltage response might even be large enough to be readily read-out with dedicated nano-voltmeters.

Figure 4A:
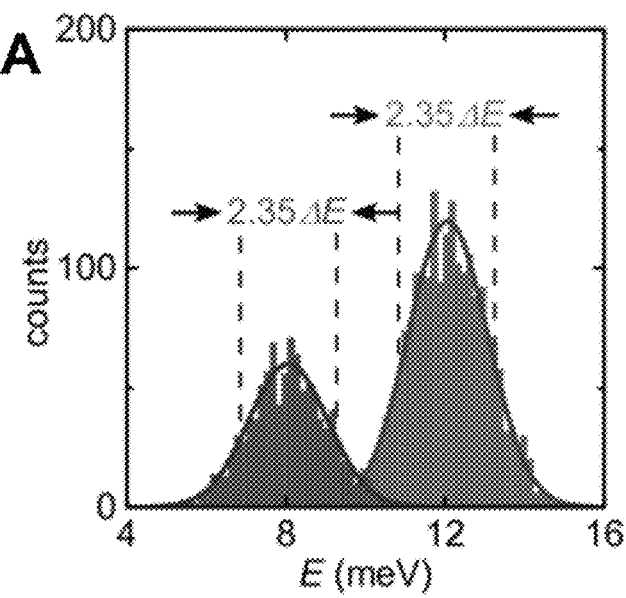
FIGS. 4A, 4B and 4C. Thermodynamic fluctuations and energy resolution.
Figure 4B:
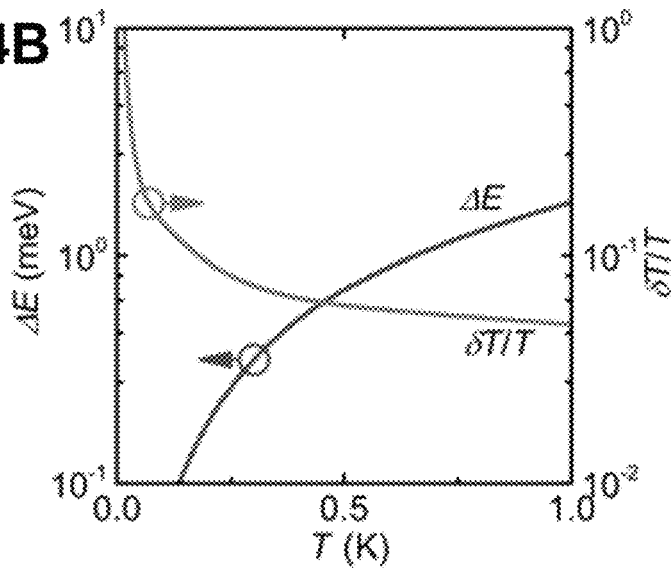
Figure 4C:
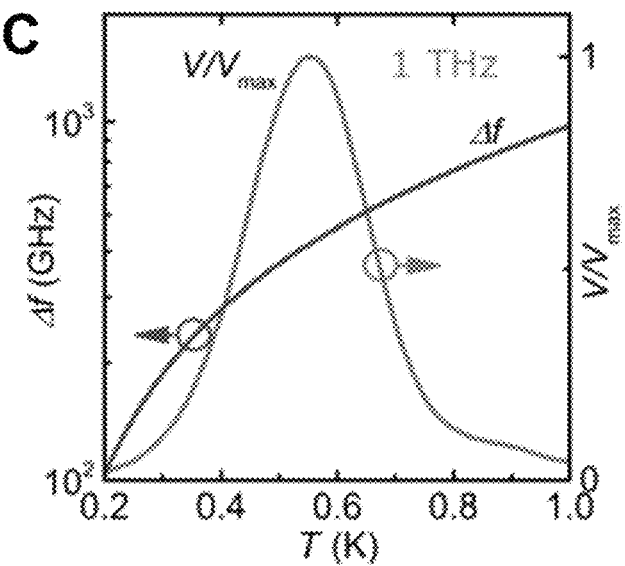

As the amplitude of the sensor/detector response increases monotonically with increasing photon frequency it is possible to resolve the energy of an absorbed photon from the transient response. On the timescale of the system's thermal relaxation time, the ultimate possible energy resolution of a calorimeter without feedback is governed by thermodynamic energy fluctuations $\langle \Delta E^2 \rangle = k_B T^2 C$. One can understand these thermodynamic fluctuations in terms of random fluctuations of the internal energy of the electron distribution due to its statistical nature as a canonical ensemble in thermal exchange with the bath. FIG. 4A illustrates the measurement uncertainty with an exemplary histogram of the detected energy distribution of two energetically different photons after measuring thousands of photons. Due to the energetic broadening, two photon energies can be distinguished only if their energies are separated by more than the full width at half maximum of $\Delta E$. FIG. 4B shows the energy scale $\Delta E = \sqrt{\langle \Delta E^2 \rangle}$ and the associated relative temperature $\delta T = \Delta E/C_e$ of these fluctuations in the MATBG device as a function of the device temperature. At $T_c$ the energy fluctuations are on the order of $\Delta E \sim 1$ meV and the relative temperature fluctuations are on the order of $\delta T < 0.1$ T. It is important to note that $\delta T$ does not correspond to actual fluctuations of the device temperature, but rather to the temperature scale of thermal energy between macro-states of the system, as a calorimeter directly measures thermal energy. FIG. 4C shows the maximum photon frequency resolution $$\Delta f_{ph} = 2.35 \cdot \frac{\Delta E}{h}$$

in MATBG, which is limited by thermodynamic fluctuations. The relative photoresponse amplitude is depicted at $f_{ph}=1$ THz. At optimum operation temperatures the present inventors found that the sensor of the present invention allows for an energy resolution in the 0.4 THz range, which is on par with the most sensitive calorimeters for THz applications (see FIG. 7F for other SC domes). The present inventors note that in a calorimeter with strong electrothermal feedback, the energy resolutions can surpass this thermodynamic limit by a factor of $2/\sqrt{\alpha}$, with $$\alpha = \frac{T}{R(T)}\frac{dR(T)}{dT}.$$

For the device/sensor/detector of the present invention, the present inventors found $\alpha \sim 15$ which gives an energy resolution of ~0.2 THz.

Calculation of Heat Capacity and Cooling Time:

To determine heat capacity and cooling time, one starts from the kinetic equation in the absence of external fields and particle flow for the distribution function of electrons with momentum k and in band $\lambda$, $f_{k,\lambda}$, i.e. (Principi, A. et al. Super-Planckian Electron Cooling in a van der Waals Stack. Phys. Rev. Lett. 118, 126804 (2017)):

$$\partial_t f_{k,\lambda} = I[f_{k,\lambda}], \quad (1)$$

where the collision integral of the electron-phonon interaction reads:

$$I[f_{k,\lambda}] = 2\pi \sum_{k',\lambda'}\sum_{q,\nu} |V(q,\nu)|^2 \quad (2)$$
$$\{D_{k,\lambda;k',\lambda'}[f_{k,\lambda}(1-f_{k',\lambda'})n_{q,\nu} - f_{k',\lambda'}(1-f_{k,\lambda})(n_{q,\nu}+1)]$$
$$\delta(k'-k-q)\delta(\varepsilon_{k',\lambda'} - \varepsilon_{k,\lambda} - \omega_{q,\nu}) + \{k,\lambda \leftrightarrow k',\lambda'\}\}.$$

Here $V(q,\nu)$ is the interaction between electrons and the phonon mode $\nu$ (e.g., longitudinal or transverse), and $D_{k,\lambda;k',\lambda'}$ is the modulus square of the matrix element between the initial and final states $k,\lambda$ and $k',\lambda'$ of the electronic operator to which the phonon displacement is coupled. For the sake of the definiteness, the operator will be assumed to be the electronic density. Other phonon models have been addressed in the literature, but will not be discussed here where the focus is to provide an order-of-magnitude estimate for the cooling time. In Eq. (2), $\varepsilon_{k,\lambda}$ and $\omega_{q,\nu}$ are respectively the electron and phonon energies, while $f_{k,\lambda}$ and $n_{q,\nu}$ are their distribution functions. In equilibrium, $f_{k,\lambda}$ ($n_{q,\nu}$) is the Fermi-Dirac (Bose-Einstein) distribution.

Assuming that $f_{k,\lambda}$ and $n_{q,\nu}$ are the Fermi-Dirac and Bose-Einstein distribution at the temperature $T_e$ and $T_L$, respectively, each of the two subsystems (electrons and lattice vibrations) are therefore in thermal equilibrium, but the system as a whole is not. To determine the rate of heat conduction between them, Eq. (1) is multiplied by $\varepsilon_{k,\lambda} - \mu$, where $\mu$ is the chemical potential, and we integrate it over k and sum over $\lambda$. Expanding for $T_e \rightarrow T_L$, one gets $C\partial_t T_e = \Sigma(T_e - T_L)$, (3) where $$C = \sum_{k,\lambda}(\varepsilon_{k,\lambda} - \mu)\left(-\frac{\partial f_{k,\lambda}}{\partial \varepsilon_{k,\lambda}}\right)\left(\frac{\varepsilon_{k,\lambda}-\mu}{T_e} + \frac{\partial \mu}{\partial T_e}\right) \quad (4)$$

is the heat capacity, and $$\Sigma = -2\sum_{q,\nu}|V(q,\nu)|^2 \frac{\omega_{q,\nu}^2}{T_L}\left(-\frac{\partial n_{q,\nu}}{\partial \omega_{q,\nu}}\right)\text{Im}[\chi(q,\omega_{q,\nu})]. \quad (5)$$

In Eq. (4), $$\frac{\partial \mu}{\partial T_e} = -\frac{\sum_{k,\lambda}\left(-\frac{\partial f_{k,\lambda}}{\partial \varepsilon_{k,\lambda}}\right)\left(\frac{\varepsilon_{k,\lambda}-\mu}{T_e}\right)}{\sum_{k,\lambda}\left(-\frac{\partial f_{k,\lambda}}{\partial \varepsilon_{k,\lambda}}\right)}, \quad (6)$$

which is obtained by assuming the density to be independent of $T_e$ (and fixed, e.g., by an external gate). In Eq. (5), $$\text{Im}[\chi(q,\omega_{q,\nu})] = \quad (7)$$
$$-\pi \sum_{k,\lambda,\lambda'}(f_{k,\lambda} - f_{k+q,\lambda'})D_{k,\lambda;k+q,\lambda'}\delta(\varepsilon_{k+q,\lambda'} - \varepsilon_{k,\lambda} - \omega_{q,\nu}).$$

The cooling time is therefore defined by $\tau^{-1} = \Sigma/C$.

An estimate for the cooling time is now provided. The goal is to approximate $\text{Im}[\chi(q,\omega_{q,\nu})]$ in Eq. (7). To do so, it is noted that at $T \sim 1$ K only phonons with energies of the order of $4 k_B T \sim 0.3$ meV contribute to the integral, thanks to the derivative of the Bose-Einstein distribution which strongly suppresses higher energy excitations. Such energies correspond to phonon momenta of the order of $q \sim 0.05$ nm$^{-1}$ (using a phonon velocity $c_{ph} = 10^4$ m/s). Typical electron momenta are of the order of $2\pi/L_{moire} \sim 0.1$-$0.4$ nm$^{-1}$, i.e. much larger than phonon momenta. One can therefore estimate $\text{Im}[\chi(q,\omega_{q,\nu})]$ in the limit of zero temperature and $q \rightarrow 0$. Restricting to the two flat bands, and approximating the matrix element as $D_{k,\lambda;k',\lambda'} = 1$ (which provides with an upper limit to $\tau^{-1}$), and assuming that the bands are nearly particle-hole symmetric, after a few manipulations one gets:

$$\text{Im}[\chi(q,\omega_{q,\nu})] \simeq \frac{\pi}{2}\left[f\left(\frac{\omega - 2\mu}{2k_B T_e}\right) - f\left(-\frac{\omega + 2\mu}{2k_B T_e}\right)\right]N\left(\frac{\omega}{2}\right), \quad (7)$$

where $f(x) = (e^x + 1)^{-1}$ is the Fermi-Dirac distribution and $N(\varepsilon)$ is the density of states at the energy $\varepsilon$. $N(\varepsilon)$ is calculated from the continuum model of Koshino, M. et al. Maximally Localized Wannier Orbitals and the Extended Hubbard Model for Twisted Bilayer Graphene. Phys. Rev. X 8, 031087 (2018). Eq. (5) is then readily evaluated with (Das Sarma, S., Adam, S., Hwang, E. H. & Rossi, E. Electronic transport in two-dimensional graphene. Rev. Mod. Phys. 83, 407-470 (2011):

$$|V(q,\nu)|^2 = \frac{\hbar g^2 q}{2\rho c_{ph}}, \quad (8)$$

where (see also Ni, G. X. et al. Fundamental limits to graphene plasmonics. Nature 557, 530-533 (2018)) $g = 3.6$ eV, $\rho = 7.6 \times 10^{-7}$ kg/m$^2$ and $\hbar$ is the reduced Planck's constant. Note that, by knowing the expression for the density of states $N(\varepsilon)$, the integrals over momenta in Eqs. (4) and (6) can be readily recast into integrals over band energies.

Calculation of Detector Response and Energy Resolution:

After calculating the electronic heat capacity $C_e(T)$ for MATBG as a function of temperature, the photon-induced temperature increase is calculated by equating the energy of an absorbed photon $E_{photon}$ with the temperature-induced increase in internal energy $$E_{photon} = h \cdot f_{photon} = \int_{T_0}^{T_{max}} C_e(T) dT. \quad (9)$$

Here h is Planck's constant, $f_{photon}$ is the frequency of the absorbed photon, $T_0$ is the temperature of the MATBG before photon absorption and $T_{max}$ is the temperature of the MATBG directly after photon absorption. Solving for $T_{max}$ as a function of $f_{photon}$ and $T_0$ allows us to calculate the photon energy-dependent thermal response of the MATBG sheet.

With the experimentally obtained R(T) and the calculated temperature increase $\Delta T(T_0, f_{photon}) = T_{max}(f_{photon}, T_0) - T_0$, the change in the MATBG's resistance upon absorption of a photon is calculated. Using a current I just below the experimentally obtained critical current $I_c$, the voltage drop $\Delta V(T_0, f_{photon}) = I \cdot \Delta R(T_0, f_{photon})$ is calculated.

Due to the fast ~100-fs thermalization time (Tielrooij, K. J. et al. Photoexcitation cascade and multiple hot-carrier generation in graphene. Nat. Phys. 9, 248-252 (2013)) after photon absorption, the rise-time of the temperature transient is assumed to be instantaneous compared to the subsequent thermal relaxation, which is modelled by an exponential decay with time constant τ as obtained from the calculations in "Calculation of heat capacity and cooling time" above. The corresponding transient voltage response is then calculated from R(T(t)).

On a timescale of the system's thermal time constant, the internal energy of a calorimeter in thermal equilibrium with the bath fluctuates by an amount $\langle \Delta E^2 \rangle = k_B T^2 C$ (Chui, T. C. P., Swanson, D. R., Adriaans, M. J., Nissen, J. A. & Lipa, J. A. Temperature fluctuations in the canonical ensemble. Phys. Rev. Lett. 69, 3005-3008 (1992)). This energy scale determines the uncertainty of any given energy measurement in a calorimeter and is such regarded as the thermodynamic limit on the energy resolution of the calorimeter. The full width at half maximum of the distribution in E is taken as the energetic discrimination threshold to distinguish the energies of two incident photons.

The sensor of the present invention object of the above described experiments and theoretical analysis, has the following characteristics:

Implements a superconducting nano-calorimeter for sensitive energy resolved broadband photo-detection from visible light to terahertz frequencies.

Single photon sensitivity for the whole spectrum from visible to terahertz frequencies.

Sensitive energy resolution of 0.2 THz

High quantum efficiency QE>90%

Low dark count rate <1 Hz high detector speed ~4 ns

FIG. 6 shows different possible alternative arrangements for the sensor of the present invention, for which the MATBG superconducting film is the active area SC of the nano-calorimeter. For the illustrated embodiments, the active area SC of the nano-calorimeter is patterned into a rectangular shape comprising a width of B=250 nm and a length of A=250 nm using dedicated nano-fabrication techniques. Depending on the type of application, the width A and length B can be in the range of 100 nanometer for low energy detection up to 100 μm for application that demand for a large detector area. The active region can further be shaped to form a nanowire with a width A of around 100 nm and length B of around 100 μm up to 1 mm in order to increase the resistance and effective detector area of the active region. The active area SC is electrically contacted via two metal electrodes E1 and E1. The electrodes, E1 and E2, provide the electrical contact of the active area SC to dedicated read-out electronics.

For particular applications at low photon energies, as depicted in FIGS. 6C, 6D, 6E, 6F, the shape of the electrodes, E1 and E2 can form an antenna with width C and length D, which enables a coupling of radiation to the active area SC with almost 100% efficiency. Depending on the demands of the application, the width C and length D can be between 10 μm and 1 mm. For applications in the mid-infrared to near-infrared, the electrically contacted active region can further be embedded in a ring resonator, Fabry-Perot cavity or in a photonic crystal cavity. The shape and dimensions of the active area SC can be adjusted in order allow easy integration with different antenna and cavity designs in order to match the desired detection wavelength. The electrical contact of the active area to dedicated read-out electronics can be either provided via the coupled THz antenna or via nanofabricated electrodes in the case of a cavity coupling for visible and infrared radiation.

Although the above described embodiments refer to a calorimeter, as described in a previous section, a bolometer (such as hot electron bolometer) is also a possible implementation of the sensor of the present invention.

Moreover, it must be noted that, in order to avoid obscuring the present invention, some well-known components (heat reservoir, thermal link, read-out electronics, cooler, etc.) of superconducting calorimeters/bolometers have not been either described in detail herein or depicted in the schematic drawings of FIGS. 1A-1B and 6A-6F. It will be apparent, however, to one skilled in the art, that the present invention may be practiced without describing those specific details.

A person skilled in the art could introduce changes and modifications in the embodiments described without departing from the scope of the invention as it is defined in the attached claims.

What is claimed is:

1. A superconducting transition-edge thermal sensor, comprising a superconducting film defining an active area for incidence of quanta thereon, wherein said superconducting film is made of a superconductor having a critical temperature $T_c$, exhibiting a charge carrier density below $10^{13}$ cm$^{-2}$ and an electronic heat capacity below $10^3$ $k_b$ at said critical temperature T, wherein the superconductor is formed by at least two layers of two-dimensional crystals stacked on top of another.

2. The superconducting transition-edge thermal sensor according to claim 1, wherein said at least two layers are two layers of graphene twisted by an angle of 1.1°±0.1° with respect to each other so that they form a Moiré superlattice.

3. The superconducting transition-edge thermal sensor according to claim 1, wherein said at least two layers are two bilayers of graphene twisted by an angle of 1.3°±0.1° with respect to each other so that they form a Moiré superlattice, wherein the graphene layers within each bilayer are aligned at 0.0° with respect to each other.

4. The superconducting transition-edge thermal sensor according to claim 1, wherein said at least two layers are two bilayers of WSe$_2$ twisted by an angle ranging from 1° to 4° with respect to each other so that they form a Moiré superlattice, whereas the WSe$_2$ layers within each bilayer are aligned at 0.0° with respect to each other.

5. The superconducting transition-edge thermal sensor according to claim 1, wherein said at least two layers are three layers of graphene which are aligned with a twist angle of 0° with respect to each other, with a stacking order of the graphene layers corresponding to an ABC stacking order, forming a trilayer graphene.

6. The superconducting transition-edge thermal sensor according to claim 1, wherein said at least two layers are hermetically air- and water-sealed with a sealing material.

7. The superconducting transition-edge thermal sensor according to claim 1, further comprising at least two electrodes arranged and making electrical contact with respective locations of the active area of the superconducting film longitudinally distanced from each other, wherein said at least two electrodes are operatively connected with a control unit to current- or voltage-bias the superconducting film and/or to read-out an electrical signal caused or modified by a transition between a superconducting and a non-superconducting phase occurring in the active area upon incidence of said quanta thereon.

8. The superconducting transition-edge thermal sensor according to claim 1, wherein the active area of the superconducting film is configured and arranged to undergo a transition between a superconducting and a non-superconducting phase upon incidence of quanta included in electromagnetic radiation having a wavelength of interest.

9. The superconducting transition-edge thermal sensor according to claim 1, which constitutes a calorimeter configured and arranged for measuring the energy of single quanta incident on the active area of the superconducting film.

10. The superconducting transition-edge thermal sensor according to claim 1, which constitutes a bolometer configured and arranged for measuring the energy flux of quanta incident on the active area of the superconducting film.

11. The superconducting transition-edge thermal sensor according to claim 2, wherein said at least two layers are hermetically air- and water-sealed with a sealing material.

12. The superconducting transition-edge thermal sensor according to claim 3, wherein said at least two layers are hermetically air- and water-sealed with a sealing material.

13. The superconducting transition-edge thermal sensor according to claim 4, wherein said at least two layers are hermetically air- and water-sealed with a sealing material.

14. The superconducting transition-edge thermal sensor according to claim 5, wherein said at least two layers are hermetically air- and water-sealed with a sealing material.

15. The superconducting transition-edge thermal sensor according to claim 6, wherein said at least two layers are encapsulated by said sealing material, wherein said sealing material is an air- and water-impenetrable Van-der-Waals material.

16. The superconducting transition-edge thermal sensor according to claim 15, wherein the encapsulated at least two layers are patterned on a substrate forming nano-structures.

17. The superconducting transition-edge thermal sensor according to claim 14, wherein said at least two layers are encapsulated by said sealing material, wherein said sealing material is an air- and water-impenetrable Van-der-Waals material, and wherein said air-impenetrable Van-der-Waals material is hexagonal boron nitride, forming a heterostructure into which said trilayer graphene is embedded and which gives rise to a Moiré superlattice due to a mismatch in lattice constant.

18. The superconducting transition-edge thermal sensor according to claim 7, wherein the active area of the superconducting film is configured and arranged to undergo a transition between a superconducting and a non-superconducting phase upon incidence of quanta included in electromagnetic radiation having a wavelength of interest, and wherein:
    said at least two electrodes are configured and shaped to form an antenna for allowing or improving electromagnetic coupling between the active area and said electromagnetic radiation; and/or
    at least the active region is embedded in a ring resonator, Fabry-Perot cavity, photonic crystal cavity or other type of optical cavity, for optical coupling with said electromagnetic radiation.

19. The superconducting transition-edge thermal sensor according to claim 8, wherein said wavelength of interest ranges from the visible spectrum to THz radiation.

* * * * *